(12) United States Patent
Lu et al.

(10) Patent No.: US 8,183,118 B2
(45) Date of Patent: May 22, 2012

(54) METHOD FOR FABRICATING MOS TRANSISTOR

(75) Inventors: Tsuo-Wen Lu, Kaohsiung County (TW); Tsai-Fu Hsiao, Tainan (TW); Yu-Ren Wang, Tainan (TW); Shu-Yen Chan, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 82 days.

(21) Appl. No.: 12/868,739

(22) Filed: Aug. 26, 2010

(65) Prior Publication Data

US 2012/0052644 A1 Mar. 1, 2012

(51) Int. Cl.
*H01L 21/336* (2006.01)

(52) U.S. Cl. ............... 438/300; 438/199; 257/E21.634

(58) Field of Classification Search ............... 438/199, 438/285, 300, 275; 257/E21.634
See application file for complete search history.

(56) References Cited

U.S. PATENT DOCUMENTS

| 7,037,773 | B2 | 5/2006 | Wang | |
|---|---|---|---|---|
| 7,608,515 | B2 * | 10/2009 | Chen et al. | 438/297 |

* cited by examiner

*Primary Examiner* — Thanhha Pham
(74) *Attorney, Agent, or Firm* — Winston Hsu; Scott Margo

(57) ABSTRACT

The invention discloses a method for fabricating a MOS transistor. A substrate having thereon a gate structure is provided. A silicon nitride layer is deposited on the gate structure. A dry etching process is then performed to define a silicon nitride spacer on each sidewall of the gate structure and a recess in a source/drain region on each side of the gate structure. A transitional layer covering the gate structure and the recess is deposited. A pre-epitaxial clean process is performed to remove the transitional layer. The substrate is subjected to a pre-bake process. An epitaxial growth process is performed to grow an embedded SiGe layer in the recess. The disposable silicon nitride spacer is removed.

20 Claims, 4 Drawing Sheets

METHOD FOR FABRICATING MOS TRANSISTOR

BACKGROUND OF THE INVENTION

1. Field of the Invention

The present invention relates generally to semiconductor device manufacturing. More particularly, the present invention relates to a method for fabricating a metal-oxide-semiconductor (MOS) transistor having a gate structure and embedded SiGe.

2. Description of the Prior Art

As known in the art, strained silicon technologies have been introduced in the MOS manufacturing process in order to increase the mobility of electrons or holes, thereby attaining higher performance of a semiconductor device. For example, taking advantage of the lattice constant of SiGe layer being different from that of Si, a strain occurs in the silicon layer growing on the SiGe layer. Since SiGe has a larger lattice constant than Si, the band structure of Si is altered, thereby increasing the mobility of the carriers.

FIG. 1 and FIG. 2 shows a prior art method for fabricating a MOS transistor utilizing embedded SiGe (e-SiGe). As shown in FIG. 1, a first spacer 21 is formed on each sidewall of the gate 10. A lightly doped drain (LDD) implant is then carried out. A disposable silicon nitride spacer 22, which is formed by using hexachlorodisilane (HCD) precursor, is formed. Subsequently, recess 31 is formed by etching the substrate 1 in the source/drain region adjacent to the gate 10. Thereafter, as shown in FIG. 2, a pre-clean is carried out prior to the epitaxial growth, for example, to remove any native oxide from the substrate 1 and the recess 31 by using diluted HF (DHF). A SiGe forming process is then performed to form the embedded SiGe layer 42 in the recess 31. The SiGe forming process may comprise pre-bake, Si seed layer deposition, SiGe epitaxial growth and silicon cap formation.

However, one problem associated with the above-described prior art method is that corner rounding of the embedded SiGe layer 42 occurs in the lower corners of the recess 31, as specifically indicated by label 46. In FIG. 2, the original contour of the recess 31 is drawn in dashed line. This corner rounding phenomenon leads to disordered silicon channel between source and drain and therefore longer source to drain channel distance, which results in device performance. One approach to solving this corner rounding problem is to lower the temperature during pre-bake process, which is typically controlled at below 750° C., for example, 720° C. On the other hand, this approach is problematic because the lower pre-bake temperatures degrade the $I_{ON}$ current of the transistor device.

Therefore, a need exists for an improved method for forming a semiconductor device such as a metal-oxide-semiconductor (MOS) transistor having a gate structure and embedded SiGe, which allows a higher pre-bake temperature, for example, 800° C., for improved manufacturability and yield.

SUMMARY OF THE INVENTION

To address these and other objects and in view of its purposes, the present invention provides an improved method for fabricating a semiconductor device such as a metal-oxide-semiconductor (MOS) transistor. A substrate having thereon a gate structure is provided. A first spacer is formed on a sidewall of the gate structure. A silicon nitride spacer is then deposited on the first spacer. The silicon nitride layer and the substrate are etched to thereby form a disposable silicon nitride spacer on each sidewall of the gate structure and a recess in a source/drain region on both sides of the gate structure. A transitional layer covering the recess is then deposited. A pre-epitaxial clean process is performed to remove the transitional layer. The substrate is then subjected to a pre-bake process at 800° C. An epitaxial growth process is then performed to grow an embedded SiGe layer in the recess. The disposable silicon nitride spacer is selectively removed.

According to another aspect, the invention provides a method for fabricating a MOS transistor. A substrate having thereon a gate structure is provided. A disposable silicon nitride spacer is formed on each sidewall of the gate structure and a recess is formed in a source/drain region on each side of the gate structure. A transitional layer covering the recess is deposited. A pre-epitaxial clean process is performed to remove the transitional layer. The substrate is subjected to a pre-bake process. An epitaxial growth process is performed to grow an embedded SiGe layer in the recess. The disposable silicon nitride spacer is removed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

Figure 1:
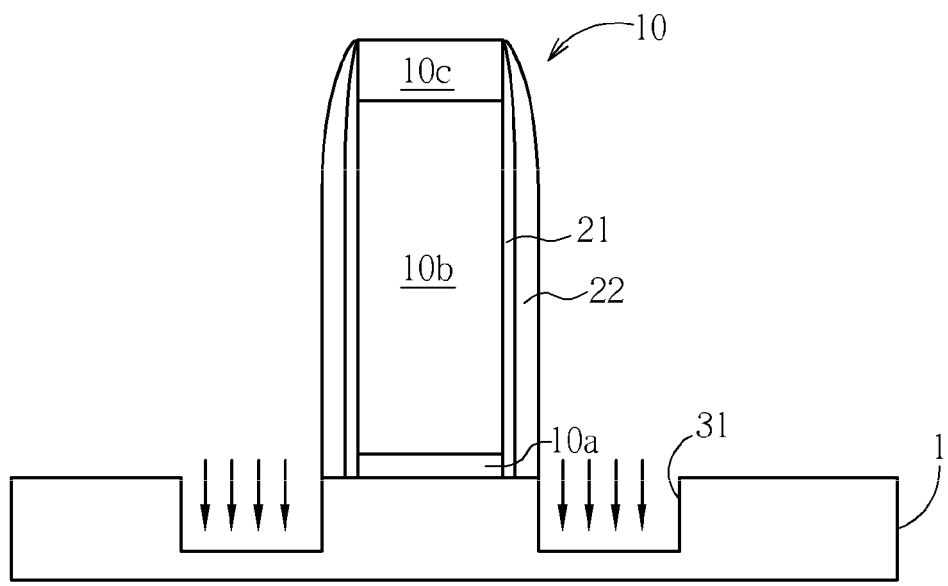
FIG. 1 and FIG. 2 shows a prior art method for fabricating a MOS transistor utilizing embedded SiGe.
Figure 2:
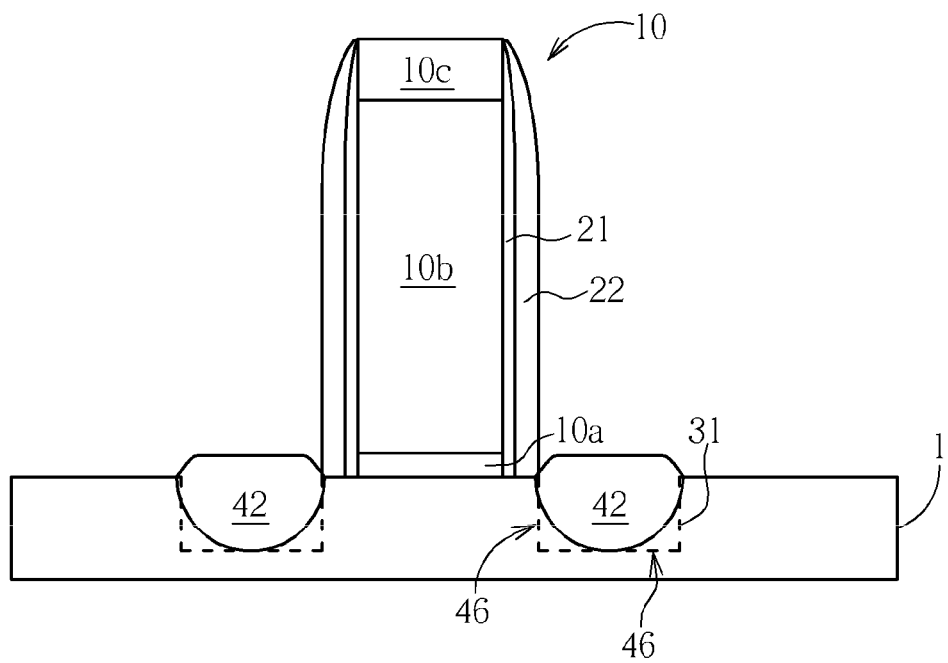
Figure 3:
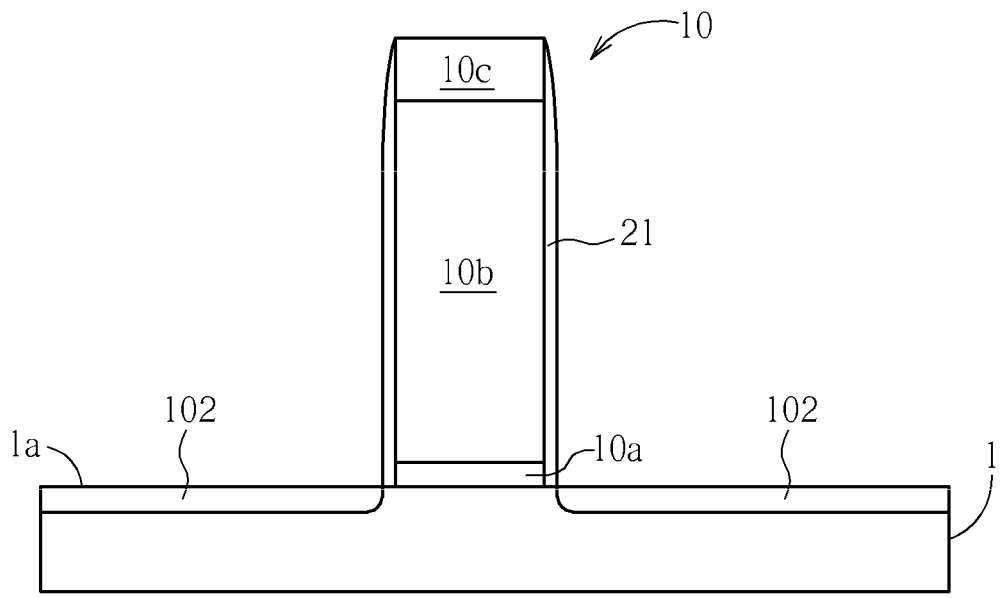
FIGS. 3-8 are schematic, cross-sectional diagrams illustrating a method for fabricating a metal-oxide-semiconductor (MOS) transistor having a gate structure and embedded SiGe in accordance with one preferred embodiment of this invention.

The following detailed description is, therefore, not to be taken in a limiting sense, and the scope of the present inven- FIGS. 3-8 are schematic, cross-sectional diagrams illustrating a method for fabricating a metal-oxide-semiconductor (MOS) transistor having a gate structure and embedded SiGe in accordance with one preferred embodiment of this invention, wherein like numeral numbers designate like layers, regions or elements. As shown in FIG. 3, a substrate 1 is provided. A gate structure 10 is formed on the main surface 1a of the substrate 1. The gate structure 10 may include but not limited to a gate dielectric layer 10a, a polysilicon layer 10b and a hard mask 10c. The hard mask 10c may be a silicon oxide hard mask or a silicon nitride hard mask. Subsequently, a first spacer (hereinafter "spacer-1") 21 is formed on each sidewall of the gate structure 10. A lightly doped drain (LDD) implant is carried out to form a LDD region 102 in the substrate 1 on both sides of the gate structure 10. According to the embodiment, the spacer-1 21 may be a silicon oxide spacer. The LDD implant is performed in a self-aligned fashion with respect to the spacer-1 21.

Figure 4:
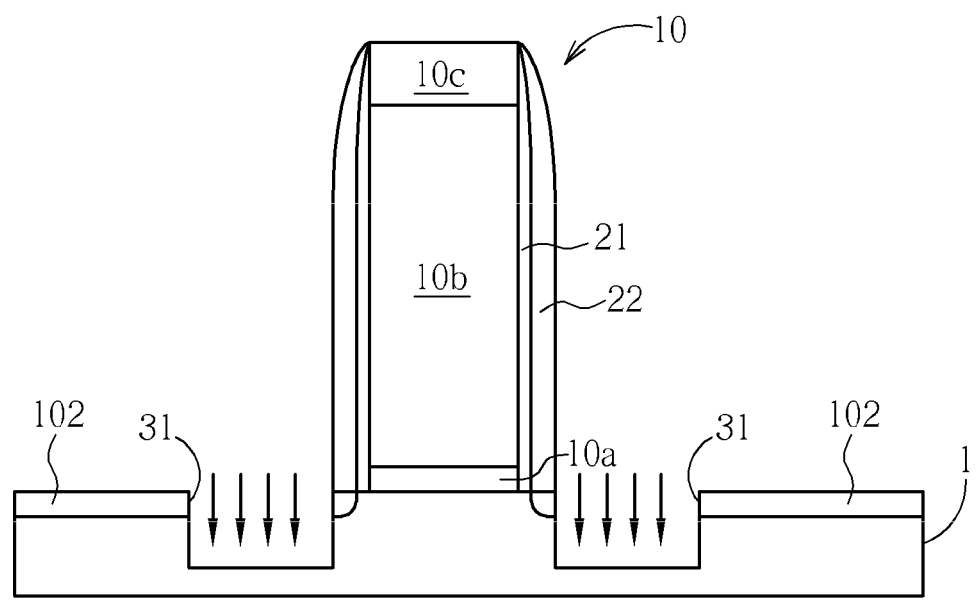

As shown in FIG. 4, using the hexachlorodisilane (HCD) as a precursor, a chemical vapor deposition (CVD) process is carried out to deposit a silicon nitride layer on the gate structure 10. Thereafter, a dry etching process is performed to etch the silicon nitride layer and the substrate 1 to thereby form a disposable silicon nitride spacer 22 on each sidewall of the gate structure 10 and a recess 31 in the source/drain region on both sides of the gate structure 10. According to the embodiment, the CVD process for depositing the silicon nitride layer may be performed in a CVD furnace manufactured by Tokyo Electron Limited incorporation. It has been found that HCD precursor introduces chlorine atoms into the disposable silicon nitride spacer 22 and the chlorine atoms may migrate to the silicon surface at 800° C. pre-bake temperature, which causes corner rounding of the embedded SiGe layer in the recess 31. The chlorine residual in the recess 31 after the pre-epitaxial clean may also contribute the undesirable corner rounding. The invention addresses this problem.

Figure 5:
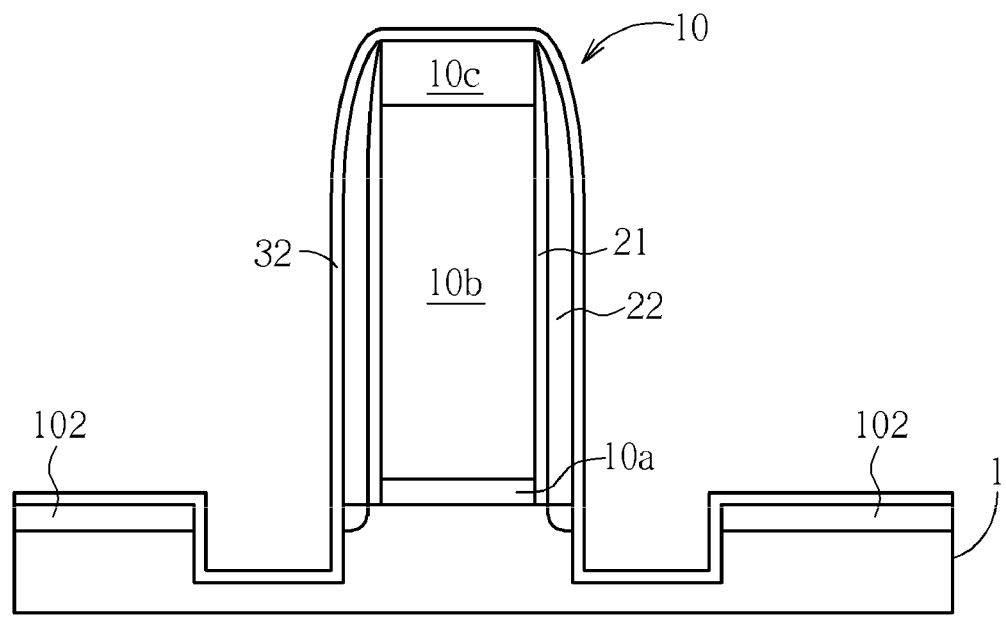

As shown in FIG. 5, after forming the recess 31, a CVD process is performed to form a conformal transitional layer 32 such as a silicon oxide layer over the gate structure 10 and the inside the recess 31. The transitional layer 32 is in direct contact with the disposable silicon nitride spacer 22. According to the embodiment, the transitional layer 32 is preferably a material layer that is capable of adsorbing, absorbing or bonding chlorine atoms and is not limited to silicon oxide. According to the embodiment, the transitional layer 32 has a thickness of about 30 angstroms, but not limited thereto.

Figure 6:
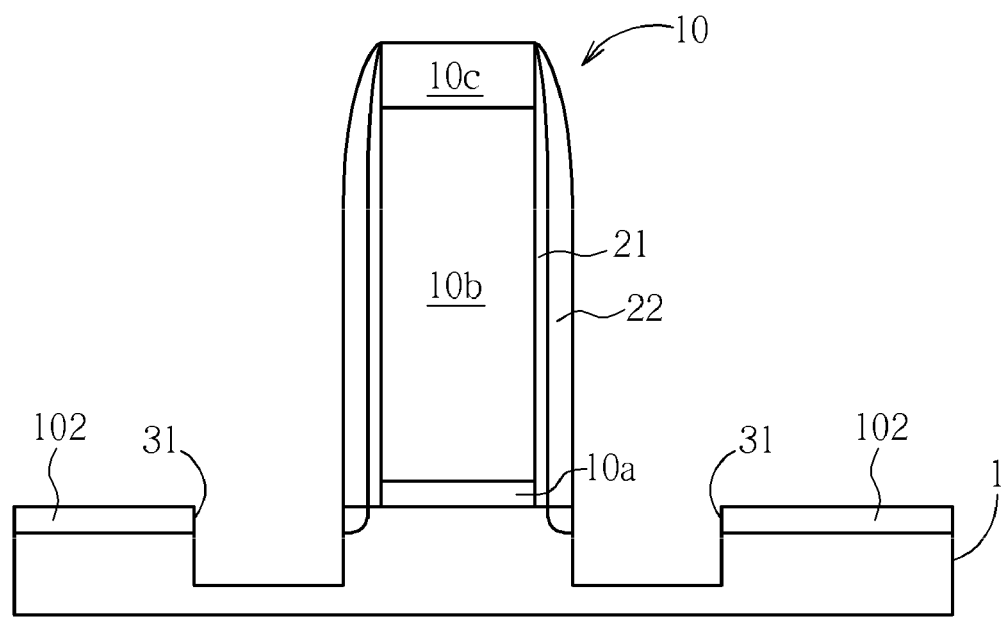

As shown in FIG. 6, subsequently, a pre-epitaxial clean process is carried out. For example, diluted HF is used to completely remove the transitional layer 32, and at the same time, the chlorine atoms bonded to the transitional layer 32 are also taken away from the substrate 1. The pre-epitaxial clean process also removes the native oxide from the substrate 1 and the recess 31. According to the embodiment, the transitional layer 32 is a silicon oxide layer and may have an etching rate of about 190 angstroms per minute in the DHF solution.

Figure 7:
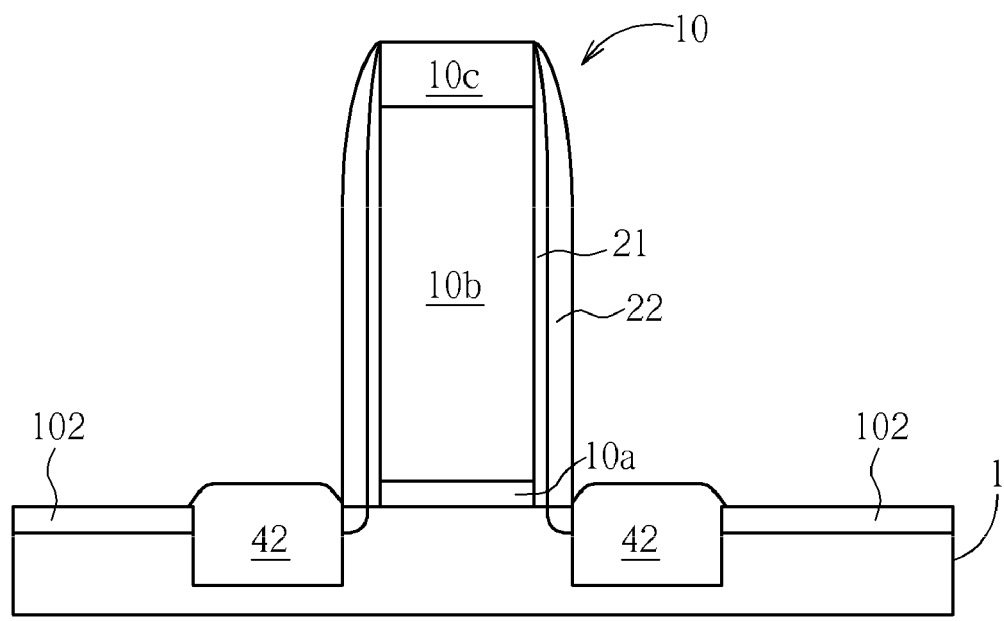

As shown in FIG. 7, a SiGe forming process is then performed to form the embedded SiGe layer 42 in the recess 31. The SiGe forming process may comprise pre-bake, Si seed layer deposition, SiGe epitaxial growth and silicon cap formation. It is noteworthy that the pre-bake is carried out at a relatively high temperature of about 800° C. Since the chlorine atoms bonded to the transitional layer 32 are removed in the previous pre-epitaxial clean process, no corner rounding occurs in the embedded SiGe layer 42 at 800° C. pre-bake temperature.

Figure 8:
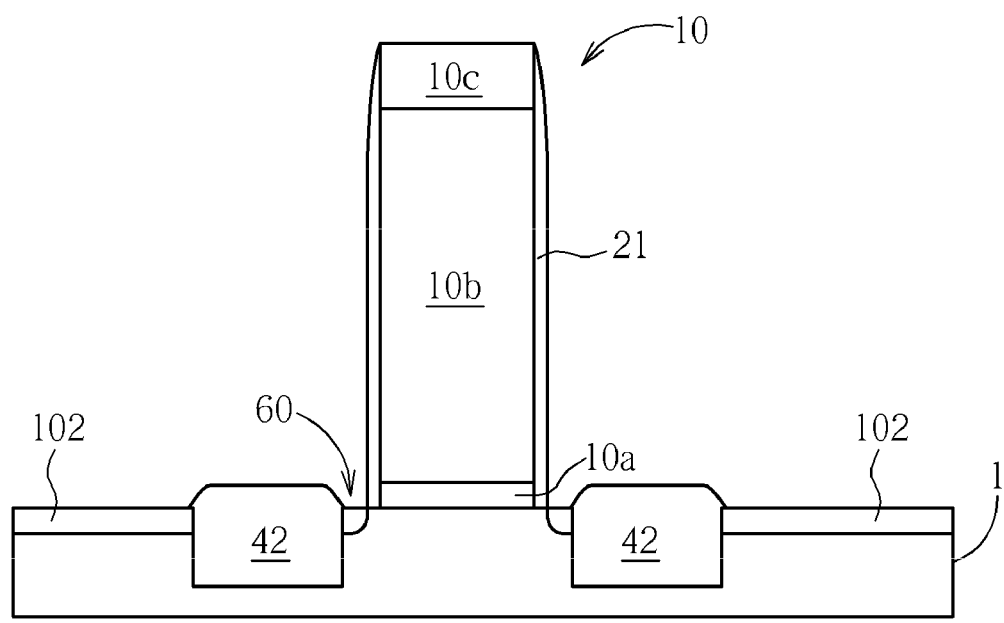

As shown in FIG. 8, after the SiGe forming process, the disposable silicon nitride spacer 22 is removed from the surface of the spacer-1 21. It is one technical feature of the invention that the disposable silicon nitride spacer 22, which is formed by using HCD as precursor, can be completely removed, that is, even the lower portion of the disposable silicon nitride spacer 22 that is stuck in the gap 60 between the spacer-1 21 and the edge of the embedded SiGe layer 42 can be completely removed.

Those skilled in the art will readily observe that numerous modifications and alterations of the device and method may be made while retaining the teachings of the invention.

What is claimed is:

1. A method for fabricating a MOS transistor, comprising:
providing a substrate having thereon a gate structure;
forming a first spacer on a sidewall of the gate structure;
depositing a silicon nitride layer on the first spacer;
etching the silicon nitride layer and substrate to form a disposable silicon nitride spacer and recess in a source/drain region on each side of the gate structure;
forming a transitional layer covering the recess;
performing a pre-epitaxial clean process to remove the transitional layer;
subjecting the substrate to a pre-bake process;
performing an epitaxial growth process to grow an embedded SiGe layer in the recess; and
removing the disposable silicon nitride spacer.

2. The method according to claim 1 wherein the gate structure comprises a gate dielectric layer, a polysilicon layer and a hard mask.

3. The method according to claim 1 wherein after forming the first spacer, the method further comprises performing a lightly doped drain (LDD) implant to form an LDD region in the substrate on both sides of the gate structure.

4. The method according to claim 1 wherein the first spacer comprises silicon oxide spacer.

5. The method according to claim 1 wherein the disposable silicon nitride spacer is formed by using hexachlorodisilane (HCD) as precursor.

6. The method according to claim 1 wherein the transitional layer is in contact with the disposable silicon nitride spacer.

7. The method according to claim 1 wherein the transitional layer comprises silicon oxide layer.

8. The method according to claim 1 wherein the transitional layer is a material layer capable of adsorbing, absorbing or bonding chlorine atoms.

9. The method according to claim 1 wherein the pre-epitaxial clean process utilizes diluted HF to completely remove the transitional layer.

10. The method according to claim 1 wherein the pre-bake process is carried out at a temperature of at least 800° C.

11. The method according to claim 1 wherein the transitional layer covers the gate structure.

12. A method for fabricating a MOS transistor, comprising:
providing a substrate having thereon a gate structure;
depositing a silicon nitride layer on the gate structure;
etching the silicon nitride layer and the substrate, thereby forming a disposable silicon nitride spacer on each sidewall of the gate structure and a recess in a source/drain region on each side of the gate structure;
forming a transitional layer covering the recess;
performing a pre-epitaxial clean process to remove the transitional layer;

subjecting the substrate to a pre-bake process;
performing an epitaxial growth process to grow an embedded SiGe layer in the recess; and
removing the disposable silicon nitride spacer.

13. The method according to claim 12 wherein the gate structure comprises a gate dielectric layer, a polysilicon layer and a hard mask.

14. The method according to claim 12 wherein the disposable silicon nitride spacer is formed by using hexachlorodisilane (HCD) as precursor.

15. The method according to claim 12 wherein the transitional layer is in contact with the disposable silicon nitride spacer.

16. The method according to claim 12 wherein the transitional layer comprises silicon oxide layer.

17. The method according to claim 12 wherein the transitional layer is a material layer capable of adsorbing, absorbing or bonding chlorine atoms.

18. The method according to claim 12 wherein the pre-epitaxial clean process utilizes diluted HF to completely remove the transitional layer.

19. The method according to claim 12 wherein the pre-bake process is carried out at a temperature of at least 800° C.

20. The method according to claim 12 wherein the transitional layer covers the gate structure.

* * * * *